United States Patent [19]
Chan et al.

[11] Patent Number: 5,883,016
[45] Date of Patent: Mar. 16, 1999

[54] APPARATUS AND METHOD FOR HYDROGENATING POLYSILICON THIN FILM TRANSISTORS BY PLASMA IMMERSION ION IMPLANTATION

[75] Inventors: Chung Chan, Newton; Shu Qin, Jamaica Plain, both of Mass.

[73] Assignee: Northeastern University, Boston, Mass.

[21] Appl. No.: 627,417

[22] Filed: Apr. 4, 1996

Related U.S. Application Data

[63] Continuation-in-part of Ser. No. 255,523, Jun. 8, 1994, Pat. No. 5,508,227.

[51] Int. Cl.$^6$ .................................................. C23C 16/48
[52] U.S. Cl. ...................... 438/798; 438/162; 118/723 I
[58] Field of Search .......................... 118/723 I; 438/162, 438/798

[56] References Cited

U.S. PATENT DOCUMENTS

| | | | |
|---|---|---|---|
| 4,764,394 | 8/1988 | Conrad | 427/38 |
| 4,891,118 | 1/1990 | Ooiwa et al. | 204/298 |
| 5,085,750 | 2/1992 | Soraoka | 118/723 MA |
| 5,131,752 | 7/1992 | Yu | 427/10 |
| 5,250,444 | 10/1993 | Khan et al. | 437/24 |
| 5,281,546 | 1/1994 | Possin et al. | 437/40 |
| 5,354,381 | 10/1994 | Sheng | 118/723 |

FOREIGN PATENT DOCUMENTS 9318201  9/1993  WIPO.

OTHER PUBLICATIONS

S. Qin, et al., "An Evaluation of Contamination From Plasma Immersion Ion Implantation on Silicon Device Characteristics", Accept and Appear in March issue of *Journal of Electronic Materials*, vol. 23, 1994, pp. 1–14.

S. Qin, et al., "The Response of a Microwave Multipolar Bucket Plasma to A High Voltage Pulse",*IEEE Transactions on Plasma Science*, vol. 19, No. 6, Dec., 1991.

M. Guerra, "The Status of Simox Technology", *Solid State Technology*, Nov., 1990, pp. 75–78.

C. Chan, et al., "Gas Fuelling of RF–Sustained Tandem Mirror End Plugs", *Nuclear Fusion*, vol. 24, No. 1, 1984, pp. 103–113.

S. Qin, et al., "Energy Distribution of Boron Ions During Plasma Immersion Ion Implantation", *Plasma Sources Sci. Technol.*, 1992, pp. 1–6.

S. Qin, et al., "Plasma Immersion Ion Implantation Doping Using A Microwave Mulipolar Bucket Plasma", *IEEE Transactions on Electron Devices*, vol. 39, No. 10, Oct., 1992.

*Primary Examiner*—Richard Bueker
*Attorney, Agent, or Firm*—Weingarten, Schurgin, Gagnebin & Hayes LLP

[57] ABSTRACT

A method for hydrogenating a thin film semiconductor wafer and an apparatus for performing the method. The method comprises the steps of applying a pulsed potential having a predetermined amplitude, a predetermined frequency, and a predetermined pulse duration to the thin film semiconductor wafer while exposing the thin film semiconductor wafer to a hydrogen plasma. The apparatus performs this method through the utilization of an inductively-coupled plasma (ICP) source so as to allow saturation of device parameter improvements within a reduced process time of 5 minutes. The ICP source allows this reduced process time to be achieved in a low energy, high dose rate plasma immersion ion implantation (PIII) hydrogenation process according to the present invention.

32 Claims, 3 Drawing Sheets

|  | n-channel TFT | | p-channel TFT | |
|---|---|---|---|---|
|  | as fabricated | 5 min PII | as fabricated | 5 min PII |
| $\mu_{eff}$ (cm$^2$/Vs) | 52.8 | 101.3 | 45.7 | 63.5 |
| $I_L$ (pA) | 252.3 | 6.52 | -163.8 | -18.9 |
| $I_{on}/I_{off}$ | 3.4x10$^5$ | 5.9x10$^7$ | 4.5x10$^5$ | 2.0x10$^7$ |
| $V_T$ (V) | 6.8 | 2.7 | -6.5 | -3.0 |
| S (V/dec) | 1.23 | 0.36 | 1.57 | 0.54 |

*FIG. 4*

APPARATUS AND METHOD FOR HYDROGENATING POLYSILICON THIN FILM TRANSISTORS BY PLASMA IMMERSION ION IMPLANTATION

CROSS-REFERENCE TO RELATED APPLICATIONS

This patent application is a continuation-in-part patent application of a patent application having Ser. No. 08/255,523, which was filed Jun. 8, 1994, now U.S. Pat. No. 5,508,227 and is presently pending.

FIELD OF THE INVENTION

This invention relates generally to semiconductor wafer processing and, more particularly, to a hydrogenation process for polysilicon thin film transistors.

BACKGROUND OF THE INVENTION

Polysilicon (poly-Si) or amorphous silicon (a-Si) thin film transistors (TFTs) are typically utilized in the active pixel matrix and the peripheral circuits of large area, flat panel liquid crystal displays. Such TFT devices are particularly useful because of the compatibility of these devices with the glass substrate of the displays. Although both poly-Si and a-Si may be used in the fabrication of TFTs, the higher mobility of carriers in poly-Si TFTs, in comparison with a-Si TFTs, suggests that poly-Si TFTs most likely will be the choice for such flat panel displays for some time to come.

In general, TFTs are fabricated in the following manner. First, a low pressure chemical vapor deposition (LPCVD) is used to deposit an undoped a-Si layer upon a fused quartz substrate. The thickness of this a-Si layer is approximately 1000 Å. The a-Si layer is then polycrystallized by heating the substrate and the a-Si layer to about 600° C. in a nitrogen atmosphere. The crystalline silicon grain size in the polycrystalline or poly-Si layer, which results from this process, is typically about 0.2 $\mu$m. Next, a 1000 Å gate oxide layer and a 3500 Å poly-Si gate electrode layer are LPCVD deposited upon this polycrystalline layer. Source/drain area and gate electrodes are then doped by self-aligned implantations. Finally, a 7000 Å oxide layer is deposited by LPCVD.

The formation of the poly-Si layers results in the creation of grain boundary and intragranular defects which highly influence the characteristics of the devices fabricated by this process and result in a significant degradation in device performance. Recent studies have indicated that there are at least two types of trap states which result from these defects in poly-Si TFTs and which lead to the degradation of device performance. One type of trap state, near the midgap of the silicon band gap, is caused by the unpaired bonds which exist at each grain boundary. A second type of trap state, called a tail state, is caused by strained bonds within the poly-Si grains.

Although the mechanism is not well understood, passivation by hydrogenation during the fabrication process has been shown to reduce the density of these trap states and to improve device performance. Some experiments suggest that for poly-Si TFTs, the threshold voltage and subthreshold slope, which are most strongly affected by the density of midgap trap states caused by unpaired bonds at the grain boundaries, respond quickly to hydrogenation, while the leakage current and field-effect mobility, which are strongly affected by strained bond tail states, respond less quickly to hydrogenation.

For passivation by hydrogenation to remove the strained bond tail states, a higher hydrogen concentration is required than for the hydrogen passivation of the midgap trap states at the grain boundaries caused by dangling bonds. This result occurs because the number of strained bonds is roughly two orders of magnitude greater than the number of dangling bonds at a gain boundary.

Although several hydrogenation methods have been investigated to improve the quality of poly-Si TFTs, such methods have typically resulted in much longer processing times (up to 16 hours) with only a limited improvement to TFT quality.

For example, hydrogenation methods presently being attempted for poly-Si TFTs include immersing the poly-Si wafer in either a radio frequency (RF) parallel plate hydrogen plasma or an electron cyclotron resonance (ECR) microwave hydrogen plasma. Typically, an RF parallel plate hydrogen plasma treatment of the wafer requires a processing time in excess of 10 hours, while an ECR microwave hydrogen plasma treatment requires a processing time in excess of 2 hours.

Further, in addition to long processing times, these two hydrogen plasma approaches have resulted in only a limited improvement in the TFT devices. For example, 16 hours of RF plasma hydrogenation for a small grain size nMOS poly-Si TFT resulted in the following changes in the device parameters. The voltage at which the device turns on, $V_{th}$, which should be as low as possible, showed only a 6 V decrease after hydrogenation. The field-effect mobility, $\mu_{eff}$, which is the velocity at which the carrier (electron or hole) can move in device channel (which determines the gain of the device and hence the speed of the device and its drive capability) and which should be as large as possible, showed only a factor of 3 increase after hydrogenation. Finally, the subthreshold swing, S, which determines how fast a device can transition from its off state to its on state and which should be as small as possible, showed only a 1.0 V/decade decrease after hydrogenation.

The lack of improvement associated with these two approaches appears to result from the limited diffusion of hydrogen through the surface of the wafer; the small sheath potential which results in a low hydrogen ion current; and the accumulation of surface charge on the insulating substrate which contributes to preventing hydrogen ions from penetrating into the wafer. The typical substrate bias of hundreds of volts in the case of the RF parallel plate hydrogen plasma and tens of volts in the case of the ECR microwave hydrogen plasma are too low to accelerate enough hydrogen ions through the surface charge and into the device channels in the wafer.

Although the conventional technique of ion implantation can also, in principal, be used for hydrogenation, ion implantation typically has an extremely high cost and low efficiency due to the large size of the wafer being implanted and the resulting long times required to scan the wafer with the hydrogen ion beam. Further, ion beam implantation hydrogenation has not resulted in a significant improvement in TFT performance. This lack of improvement is possibly due to the fact that hydrogen ions cannot be directly sent to the device channel area through the gate oxide by ion beam implantation. The hydrogen ions cannot be directly implanted because to do so would result in damage to the gate oxide and the channel lattice and a low annealing temperature, which should be lower than the melting points of either the glass substrate or aluminum interconnection, cannot correct such lattice damage.

A way that has been attempted to avoid this problem is to adjust the hydrogen ion energy so as to send the hydrogen ions into the polysilicon gate layer while keeping away from the gate oxide layer. Because of the nonplanar structure of the device, ions implanted near the edge of the gate, that is, near the corners of the source or drain and channel, are closer to the channel area. This is due to the fact that the vertical distance to the surface at these locations is less than the vertical distance to the surface above the channel.

Following hydrogen ion implantation, post-implantation annealing is performed in an attempt to cover the whole channel through the lateral diffusion of the hydrogen ions. However, due to the vertical orientation of the ion beam used in implantation, the typical hydrogen ion dose (approximately $1 \times 10^{17}/cm^2$) in the small area near the edge of gate may be not enough to passivate the whole channel. For example, the depth of penetration for a 10 keV hydrogen ion implantation for a silicon target is approximately 1500 Å. However, the vertical distance between the device channel and the top of the TFT, for example, in one device is greater than 1.15 $\mu$m (1000 Å gate $SiO_2$+3500 Å polysilicon gate+7000 Å $SiO_2$). Thus, the shortest distance between the surface and the active channel is through an 8000 Å $SiO_2$ layer measured from the gate edges. Through this path, hydrogen may then reach the active channel by diffusing laterally. Thus, even with this reduced path length, a 100 keV hydrogen ion implantation is required to reach the active channel.

Finally, a pure diffusion process can not be used to passivate the defects. Although a pure diffusion process will not damage the devices, as the hydrogen implantation just discussed will, a pure diffusion process operating at 300°–400° C. cannot bring enough hydrogen ions (up to a $1 \times 10^{17}/cm^2$ dose being required) to the device channel except after very long periods of exposure. The long times required for pure diffusion to bring a sufficient number of hydrogen ions to the device channel make such a process unacceptable for manufacturing purposes.

Thus, a hydrogenation process is desired which will not damage the devices on the wafer and yet will not require the long exposure times typical of diffusion processes.

SUMMARY OF THE INVENTION

The present invention relates to a method for hydrogenating a thin film semiconductor wafer and an apparatus for performing the method. The method comprises the steps of applying a pulsed potential having a predetermined amplitude, a predetermined frequency, and a predetermined pulse duration to the thin film semiconductor wafer while exposing the thin film semiconductor wafer to a hydrogen plasma. The apparatus performs this method through the utilization of an inductively-coupled plasma (ICP) source instead of an RF parallel plate or an ECR or microwave source. Through the use of the ICP source, saturation of device parameter improvements is achieved within a process time of 5 minutes, which is the shortest hydrogenation process time to date for achieving such results with TFT devices. The ICP source allows this reduced process time to be achieved in a low energy, high dose rate plasma immersion ion implantation (PIII) hydrogenation process according to the present invention.

It is known that dose rate is the most important factor in determining hydrogenation efficiency. Theoretically, high dose rate can be achieved by increasing pulse voltage and frequency. However, higher pulse voltage will cause higher etching rate damage on device surfaces and higher implant current (in which secondary electron emission is a big fraction) which will limit the pulse frequency. An ICP source allows high ion density and low working pressure through a combination of low energy and high dose rate PIII using a low power (~500 W) RF generator and a low power (~550 W) pulse generator. Another unique advantage of using an ICP source is its ion density uniformity over large area targets such as flat panel displays. An ECR microwave plasma source and a helicon plasma source can obtain similar ion density and working pressure for smaller area targets (~100 mm diameter), but have to sacrifice ion density and working pressure for large area targets. An ICP source and its varieties are the only candidates for a high dose rate hydrogenation process for large area targets such as 30×40 $cm^2$ flat panel displays. By combining an ICP source with low potential pulses and substrate temperature control via plasma heating, the present invention provides a significant advance in poly-Si TFT technology with its greatly reduced process time.

BRIEF DESCRIPTION OF THE DRAWINGS

This invention is pointed out with particularity in the appended claims. The above and further advantages of this invention may be better understood by referring to the following description taken in conjunction with the accompanying drawings, in which.

FIG. 4 is a table of measurements of various parameters of an nMOS TFT device and a pMOS TFT device prior to and following processing by the PIII hydrogenation apparatus shown in FIG. 1.

DETAILED DESCRIPTION OF THE INVENTION

Figure 1:
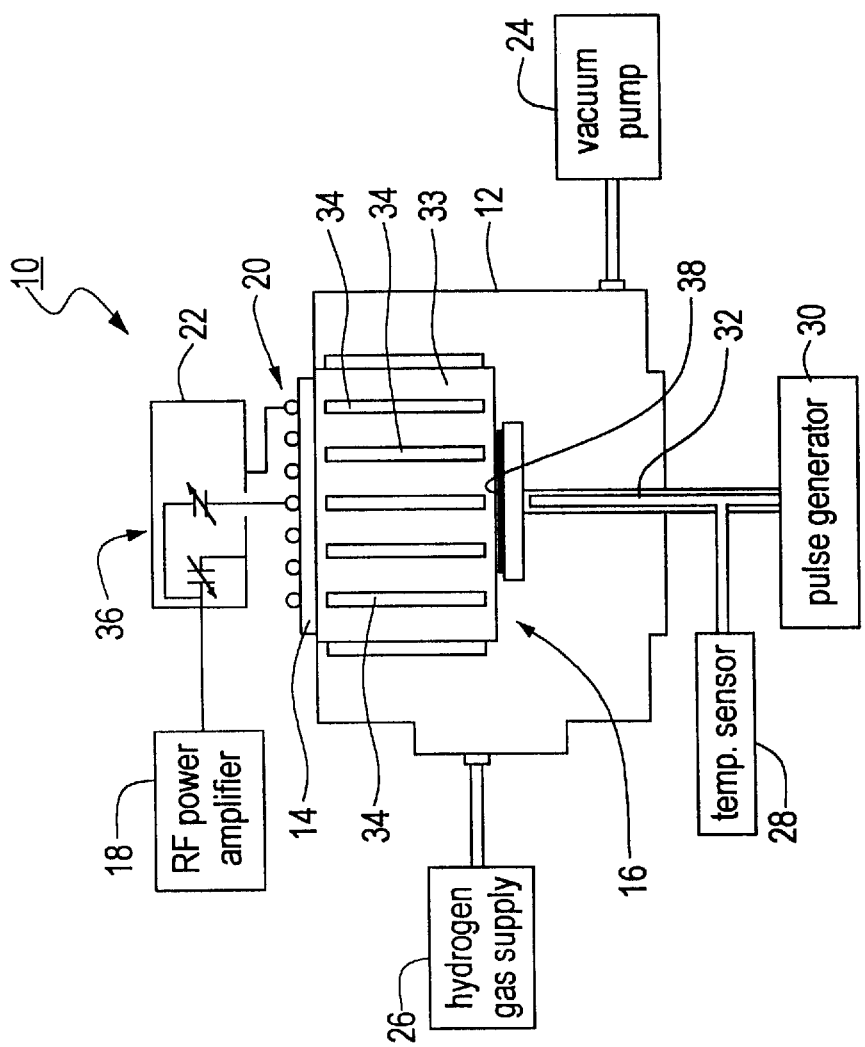
FIG. 1 is a side view of a PIII hydrogenation apparatus according to the present invention.

Referring to FIG. 1, there is shown a PIII hydrogenation apparatus 10 according to the present invention. The hydrogenation apparatus 10 comprises a cylindrical vacuum chamber 12 having a quartz window 14, a tubular multipolar magnetic confinement structure 16 enclosed within the vacuum chamber 12, a low power ICP source comprising an RF power amplifier 18, a pancake-shaped, 3-turn coil 20, and a tunable matching network 22, a vacuum pump 24, a hydrogen gas supply 26, a temperature sensor 28, and a high voltage pulse generator 30 electrically connected to a conductive wafer holder 32.

Considering each component individually, the cylindrical vacuum chamber 12, in this particular embodiment, is fabricated of aluminum. Although any material that is permeable to magnetic fields may be used for the vacuum chamber 12, aluminum is preferable to stainless steel for several reasons. First of all, the aluminum oxide, $Al_2O_3$, coating which forms on the inside of the vacuum chamber 12 resists ion sputtering. Further, any aluminum sputtering which does occur has less of a detrimental effect on the semiconductor devices being processed than does any iron sputtering which occurs when stainless steel is used. This is due to the fact that iron has a deep energy level in the silicon band gap which results primarily in increased leakage current across p-n junctions.

The quartz window 14 allows RF energy generated by the ICP source to pass therethrough and into the chamber 12 so as to induce the formation of hydrogen ion plasma.

The tubular multipolar magnetic confinement structure 16 comprises an aluminum cylinder 33 with an even number of permanent magnetic bars 34 arranged longitudinally around the circumference thereof. These magnetic bars 34 are arranged such that successive north and south poles face the interior of the aluminum cylinder 33 so as to confine any plasma within the aluminum cylinder 33 within a multipolar magnetic field. In this particular embodiment, each of the magnetic bars 34 produces a magnetic field of about 1000 Gauss at their respective poles. Although permanent magnets are used in this particular embodiment, electromagnets may also be used to create the multipolar magnetic field.

The number of magnets and the field strength of each magnet are chosen such that there is a substantially uniform ion density in a radial direction along the longitudinal axis of the aluminum cylinder 33. The benefits of using this form of confinement structure 16 are that a higher ion density and a better radial ion density uniformity are obtained in the confinement structure 16 because electrons are reflected back into the plasma by the magnetic field instead of being lost to the walls of the aluminum cylinder 33. In principle, the lower the magnetic field strength that is used, the smaller the size of the confinement structure 16 that can be used to obtain the same ion density uniformity.

At this point it should be noted that, as an alternative embodiment, the vacuum chamber 12 and the confinement structure 16 may be combined by having the magnetic bars 34 located on the outside of the chamber 12. Such an embodiment alleviates the need for the aluminum cylinder 33 and thus eliminates plasma losses from within such an aluminum cylinder 33 into the other areas of the vacuum chamber 12. The size of the vacuum chamber 12 determines the feasibility of such an alternative embodiment. For instance, a relatively large or oddly shaped vacuum chamber would generally preclude such an alternative embodiment.

At this point it should be noted that the magnetic confinement structures resulting from either of the above-described embodiments are commonly referred to as magnetic buckets.

The low power ICP source provides, in this particular embodiment, approximately 500 Watts of continuous wave power at a frequency of 13.56 MHz. The RF power amplifier 18 provides an RF signal, which can be finely tuned to the 13.56 MHz frequency by the matching network 22, to the pancake-shaped, 3-turn coil 20. The matching network 22 is equipped with variable capacitors 36 so as to perform the fine tuning. The coil 20 radiates the RF power through the quartz window 14 and into the vacuum chamber 12. It should be noted that the coil 20 is centered along the longitudinal axis of the aluminum cylinder 33 so as to insure a uniform ion density within the confinement structure 16. As will be explained in detail below, the advantages of using the low power ICP source over prior art plasma forming schemes in inducing the formation of the hydrogen ion plasma include higher ion density, lower working pressure, and better radial ion density uniformity within the confinement structure 16 of the vacuum chamber 12, which is particularly important in the processing of large area, active matrix liquid crystal displays.

The conductive wafer holder 32, which is fabricated of stainless steel and is encased in quartz to minimize contamination, is centered along the longitudinal axis of the aluminum cylinder 33 and is strategically positioned within or immediately below the confinement structure 16 so as to be directly exposed to the hydrogen plasma formed and contained within the confinement structure 16. The support portion of the wafer holder 32 passes through the wall of the vacuum chamber 12 so as to allow the high voltage pulse generator 30 to be connected thereto. The high voltage pulse generator 30 applies a series of negative high voltage pulses to the wafer holder 32 and thereby to a silicon wafer 38 located on the wafer holder 32. The high voltage pulse generator 30 allows the pulse frequency, the pulse amplitude, and the pulse width to all be individually adjusted. It should be noted, however, that the use of a low power ICP allows high dose rate PIII to be performed at low energy with a pulse voltage of −2 kV, a pulse repetition frequency (prf) of 16.7 kHz, and a pulse width of 5 $\mu$sec.

The temperature sensor 28, in this particular embodiment, comprises a thermocouple connected to the wafer holder 32, although other temperature sensing means such as an infrared pyrometer could be used. The support portion of the wafer holder 32 is hollow so as to allow thermocouple wires to be positioned as close to the wafer 38 as possible. The temperature sensor 28 is used to monitor the surface temperature of the wafer 38 so that the temperature of the wafer 38 can be optimized during the hydrogenation process. In this particular embodiment, the temperature of the wafer 38 is maintained at 350° C., which is the temperature at which the wafer 38 would normally be annealed. The temperature of the wafer holder 32, which is in direct contact with the wafer 38 and thereby directly effects the temperature of the wafer 38, can be controlled to an optimal value by modifying the implantation of the hydrogen ions by adjusting such parameters as RF power, pulse frequency rate, and pulse width. Additionally, a heated/cooled wafer holder may be utilized to further control the temperature of the wafer 38 without constraining the other system parameters.

The vacuum pump 24 and the hydrogen gas supply 26 work together to provide an ample supply of hydrogen gas to the vacuum chamber 12 at an appropriate pressure for processing. The sequence by which this condition is achieved is as follows. After the wafer 38 is mounted on the wafer holder 32 within the vacuum chamber 12 and the chamber is sealed, the pressure in the vacuum chamber 12 reduced to approximately $10^{-6}$ Torr. Hydrogen gas is then introduced into the vacuum chamber 12 so as to raise the pressure within the vacuum chamber 12 to approximately 0.6 mTorr, the working pressure. The hydrogen gas is then ionized into a plasma by the radiated RF energy emitted by the coil 20. Typical equilibrium parameters of hydrogen plasma so generated by this process are: plasma density $n_i \approx 6 \times 10^{10}/cm^3$, electron temperature $T_e \approx 5$ eV, and plasma potential $V_p \approx 20$ V.

Having provided a description of the various components of the PIII hydrogenation apparatus 10, the following experimental account will provide a more detailed illustration of the benefits of employing an ICP source in the hydrogenation of poly-Si TFT's.

EXPERIMENTAL ACCOUNT

In this experiment, an ICP source was used for the first time for PIII hydrogenation for defect passivation in polycrystalline or poly-Si TFTs. The result is an optimum hydrogenation process for poly-Si TFTs using low energy (~2 keV), high dose rate (~$10^{16}/cm^2$ sec) plasma immersion ion implantation. Device parameter improvements are achieved with a process time of 5 minutes, which is a fraction of the process times that were required to achieve similar device parameter improvements in previously conducted experiments such as an 8 hour conventional parallel plate plasma treatment, an 80 minute ECR microwave plasma treatment, and a 30 minute microwave plasma PIII process with a 4 kHz pulse repetition frequency. (see J. D. Bernstein, S. Qin, C. Chan, and T. J. King, "Hydrogenation of Polycrystalline Silicon Thin Film Transistors by Plasma Ion Implantation," IEEE Electron Device Lett., vol. 16, no. 10, pp. 421–423, 1995). In fact, the 5 minute process time is the shortest hydrogenation process time achieved to date for TFT devices having a structure as described above.

The ICP source and a relatively low average power (~550 Watt) pulse generator described above were both used in this PIII hydrogenation experiment. The high dose rate was achieved by the ICP source and the low energy implantation. The use of the ICP source allows a higher ion density and a lower working pressure than a microwave plasma source, which had been used in previous PIII experiments. Lower energy implantation allows a much higher pulse repetition frequency (16.7 kHz in contrast to 4 kHz of previous PIII experiments) by the pulse generator. Another unique advantage of using the ICP source is its capability for large area electronics. It is possibly the only candidate that may be used for hydrogenation and doping processes of 30×40 cm$^2$ flat panel displays.

The poly-Si TFTs that were used in this experiment have the same structure and were fabricated by the same procedures as were described above. The PIII hydrogenation process conditions were as follows: a base pressure of <10$^{-6}$ Torr, a working pressure of 0.6 mTorr, a hydrogen gas flow rate of ~16 standard cubic centimeters per minute (sccm), an RF power of 500 W, a pulse voltage of −2 kV, a pulse repetition frequency (prf) of 16.7 kHz, a pulse width of 5 $\mu$sec, and a sample temperature of 350° C. The TFT characteristics were measured with an HP 5155A semiconductor parameter analyzer.

Figure 2:
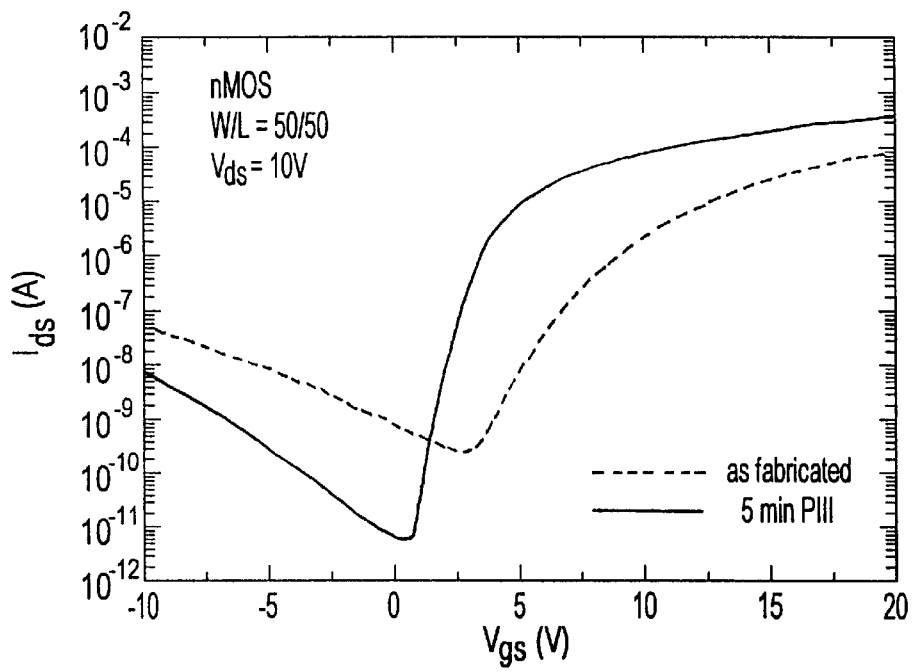
FIG. 2 is a graph of the $I_{ds}$ v. $V_{gs}$ curves for an nMOS TFT prior to and following processing by the PIII hydrogenation apparatus shown in FIG. 1.
Figure 3:
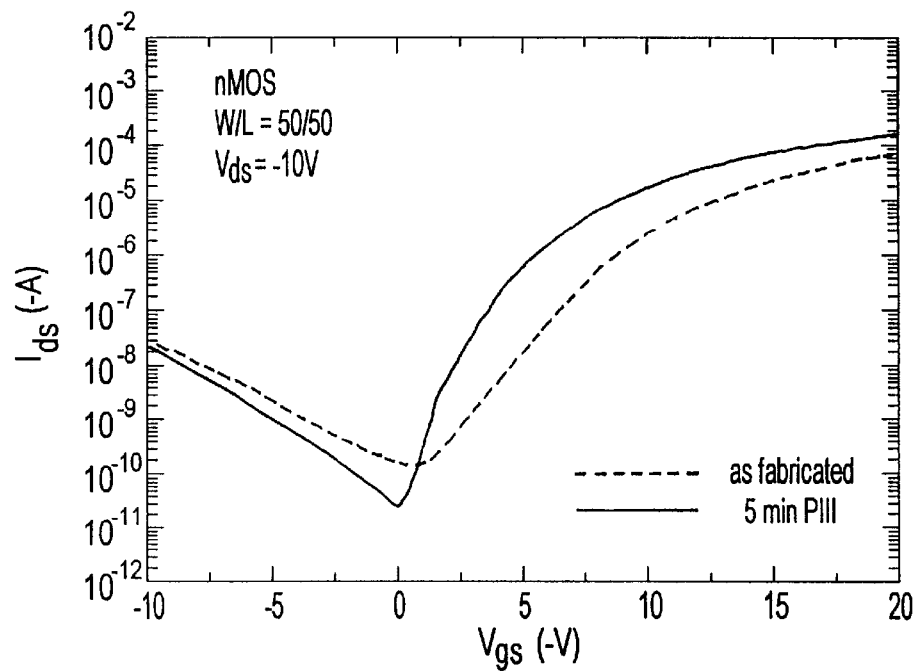
FIG. 3 is a graph of the $I_{ds}$ v. $V_{gs}$ curves for a pMOS TFT prior to and following processing by the PIII hydrogenation apparatus shown in FIG. 1.

FIGS. 2 and 3 show the $I_{ds}$-$V_{gs}$ characteristics for an n-channel TFT device and a p-channel TFT device, respectively, with both having width to length ratios of W/L=50 $\mu$m/50 $\mu$m, before and after the PIII hydrogenation process. The device parameters of effective mobility ($\mu_{eff}$), leakage current ($I_L$), threshold voltage ($V_T$), and subthreshold slope (S) were dramatically improved after the devices were subject to the PIII hydrogenation process for 5 minutes. A comparison of the n-channel device and the p-channel device parameters before and after the hydrogenation PIII process is shown in the table of FIG. 4.

In each TFT device, hydrogen ions are introduced into the device channel through the passivation oxide layer by diffusion because hydrogen ions cannot be introduced into the device channel by low energy ion implantation alone. For example, the projected penetration depth of hydrogen ions having an energy of 10 keV is approximately 1000 Å (see J. F. Ziegler, J. P. Biersack, and U. Littmark, *The Stopping Range of Ions in Solids*, Pergamon Press, New York, 1985). Therefore, hydrogen ions will not penetrate the 7000 Å-thick passivation oxide layer and the 1000 Å-thick gate oxide layer, and hydrogen ion implantation and diffusion are both major factors in high dose rate PIII hydrogenation.

Conventional parallel plate reactor immersion methods require long treatment times due to low hydrogen ion densities ($n_i$≈10$^9$/cm$^3$) and low hydrogen ion penetration energy. Hydrogen plasmas induced by microwave or ECR methods have substantially higher densities ($n_i$<10$^{10}$/cm$^3$), but their implantation efficiency is limited by a low plasma potential (~20 V). However, in the present invention PIII hydrogenation process, a high hydrogenation efficiency is attained with low energy and a high dose rate.

The PIII hydrogenation process using the ICP source allows a high dose rate due to its higher hydrogen ion density (6×10$^{10}$/cm$^3$ in contrast to 2.5×10$^{10}$/cm$^3$ from previously used microwave plasma sources) and lower working pressure (0.6 mTorr in contrast to 50 mTorr needed for previously used microwave plasma sources). Hydrogen ion diffusion is significantly enhanced by the high implanted hydrogen ion density and the large hydrogen ion concentration gradient beneath the passivation oxide surface. Ion implantation with lower pressure plasma can obtain a higher dose rate than with higher pressure plasma under the same process conditions because there are less collisions. In addition, low energy hydrogen ion implantation has some advantages. For instance, a higher pulse potential, and hence a higher energy implantation, causes higher etching rates for Si and SiO$_2$ materials and serious charging effects due to the dielectric substrate of the TFTs. (see S. Qin, J. D. Bernstein, Z. Zhao, W. Liu, C. Chan, J. Shao, and S. Denholm, "Charging effects in plasma immersion ion implantation for microelectronicsn", Journal of Vacuum Science and Technology B. vol. 13, no. 5, pp. 1994–1998, October 1995). Also, both effects reduce the dose rate. Another drawback of high energy implantation is the larger total implantation current. Because secondary electron emission is a big fraction of the total current, it causes serious charging effects and wastes the power of the pulse generator. Because the secondary electron emission coefficient is proportional to the hydrogen ion energy, low energy implantation can reduce these problems and increase the dose rate. The trap state density of poly-Si TFTs fabricated by the same process was measured at ~3.0×10$^{15}$/cm$^2$. (see T. J. King, M. G. Hack, and I. Wu, "Effective density of states distributions for accurate modeling of polycrystalline silicon thin film transistors," J. Appl, Phys., vol. 17, no. 2, pp. 908–913, 1994). In order to passivate this defect, at least the same amount of hydrogen must be introduced into the device channel to saturate the device parameter improvements. From simulations of the present invention PIII hydrogenation process, a total hydrogen implantation dose of 3×10$^{18}$/cm$^2$ is required so that a channel dose of $N_H$≈3.5×10$^{15}$/cm$^2$ can be obtained by integrating the hydrogen ion concentration in the device channel during the diffusion. Based on a collision-less dynamic sheath model including charging effects, the total implantation dose of the present invention PIII hydrogenation process is ~3×10$^{18}$/cm$^2$. This is in conformity with the simulations and with previous microwave PIII hydrogenation experiments. However, the process time of the present invention PIII hydrogenation process is only 5 minutes, about one sixth of the process time required in previously conducted PIII hydrogenation process experiments.

In view of the foregoing experimental results, it can be readily acknowledged that the present invention low energy, high dose rate PIII hydrogenation method using an ICP source has demonstrated a significant advance in poly-Si TFT technology with its greatly reduced process time. Through a combination of hydrogen ion implantation and diffusion during PIII hydrogenation, the process described herein can achieve improvements in device parameters similar to those obtained with previously proven methods in a fraction of the process time.

Having now described a preferred embodiment of the present invention, those skilled in the art will realize many variations are possible which will still be within the scope and spirit of the following claims. Therefore, it is the intention to limit the invention only as indicated by the scope of these claims.

What is claimed is:

1. An apparatus for hydrogenating a semiconductor wafer comprising:
   a magnetic bucket comprising:
      a vacuum chamber having a substantially cylindrical shape with a pair of opposing end walls, said vacuum chamber being permeable to magnetic fields;
      an even plurality of magnets having alternating polarity disposed adjacent to and spaced equally around the cylindrical circumference of said vacuum chamber; and
      a window disposed in one of said end walls, said window being permeable to electric fields;
   a gas supply in communication with said vacuum chamber for supplying gas to said vacuum chamber;
   a vacuum pump in communication with said vacuum chamber for governing pressure in said vacuum chamber;
   a conductive wafer holder disposed within said vacuum chamber for supporting a wafer thereon;
   an inductively coupled RF source disposed adjacent said window, said inductively coupled RF source providing RF energy to said vacuum chamber through said window so as to ionize said supplied gas in the vicinity of said wafer holder; and
   a high voltage pulse generator in electrical communication with said wafer holder, said high voltage pulse generator applying a pulse potential to said wafer holder, said pulse potential having a predetermined amplitude, a predetermined repetition rate, and a predetermined pulse duration.

2. The apparatus as defined in claim 1, wherein said inductively coupled RF source comprises an RF power amplifier and a conductive coil.

3. The apparatus as defined in claim 2, wherein said inductively coupled RF source further comprises a tunable matching network for fine tuning said RF energy.

4. The apparatus as defined in claim 1, further comprising a temperature sensor in communication with said wafer holder.

5. The apparatus as defined in claim 4, wherein said temperature sensor is a thermocouple.

6. The apparatus as defined in claim 1, further comprising a temperature sensor in communication with said vacuum chamber.

7. The apparatus as defined in claim 6, wherein said temperature sensor is an infrared pyrometer.

8. The apparatus as defined in claim 1, further comprising a temperature controller associated with said vacuum chamber for controlling the temperature of said wafer.

9. The apparatus as defined in claim 8, wherein said temperature controller comprises a heating/cooling system for controlling the temperature of said wafer.

10. The apparatus as defined in claim 8, wherein said temperature controller comprises a heated/cooled wafer holder for supporting said wafer.

11. The apparatus as defined in claim 1, wherein said magnets are permanent magnets.

12. The apparatus as defined in claim 1, wherein said magnets are electromagnets.

13. The apparatus as defined in claim 1, wherein said gas is hydrogen gas.

14. The apparatus as defined in claim 1, wherein said window is quartz.

15. An apparatus for hydrogenating a semiconductor wafer comprising:
   a vacuum chamber having a window disposed in a wall thereof, said window being permeable to electric fields;
   a multipolar magnetic confinement structure disposed within said vacuum chamber;
   a gas supply in communication with said vacuum chamber for supplying gas to said vacuum chamber;
   a vacuum pump in communication with said vacuum chamber for governing pressure in said vacuum chamber;
   a conductive wafer holder disposed within said vacuum chamber for supporting a wafer thereon, said wafer holder positioned within said multipolar magnetic confinement structure;
   an inductively coupled RF source disposed adjacent said window, said inductively coupled RF source providing RF energy to said vacuum chamber through said window so as to ionize said supplied gas in the vicinity of said wafer holder; and
   a high voltage pulse generator in electrical communication with said wafer holder, said high voltage pulse generator applying a pulse potential to said wafer holder, said pulse potential having a predetermined amplitude, a predetermined repetition rate, and a predetermined pulse duration.

16. The apparatus as defined in claim 15, wherein said inductively coupled RF source comprises an RF power amplifier and a conductive coil.

17. The apparatus as defined in claim 16, wherein said inductively coupled RF source further comprises a tunable matching network for fine tuning said RF energy.

18. The apparatus as defined in claim 15, further comprising a temperature sensor in communication with said wafer holder.

19. The apparatus as defined in claim 18, wherein said temperature sensor is a thermocouple.

20. The apparatus as defined in claim 15, further comprising a temperature sensor in communication with said vacuum chamber.

21. The apparatus as defined in claim 20, wherein said temperature sensor is an infrared pyrometer.

22. The apparatus as defined in claim 15, further comprising a temperature controller associated with said vacuum chamber for controlling the temperature of said wafer.

23. The apparatus as defined in claim 22, wherein said temperature controller comprises a heating/cooling system for controlling the temperature of said wafer.

24. The apparatus as defined in claim 22, wherein said temperature controller comprises a heated/cooled wafer holder for supporting said wafer.

25. The apparatus as defined in claim 15, wherein said multipolar magnetic confinement structure comprises:
   a substantially cylindrical manufacture that is permeable to magnetic fields; and
   an even plurality of magnets having alternating polarity disposed adjacent to and spaced equally around the cylindrical circumference of said cylindrical manufacture.

26. The apparatus as defined in claim 25, wherein said magnets are permanent magnets.

27. The apparatus as defined in claim 25, wherein said magnets are electromagnets.

28. The apparatus as defined in claim 15, wherein said gas is hydrogen gas.

29. The apparatus as defined in claim 15, wherein said window is quartz.

30. A method of hydrogenating a semiconductor wafer comprising the steps of:

placing a wafer in a vacuum chamber;

supplying a predetermined volume of gas to enter said vacuum chamber at a predetermined pressure;

subjecting said predetermined volume of gas to radiated energy from an inductively coupled RF source so as to ionize said gas;

confining said ionized gas at a substantially uniform density with a multipolar magnetic field to a region proximate said wafer;

applying a pulse potential to said wafer, said pulse potential having a predetermined amplitude, a predetermined repetition rate, and a predetermined pulse duration; and exposing said wafer with said pulsed potential to said hydrogen ion plasma for a predetermined amount of time.

31. The method as defined in claim 30, wherein said gas is hydrogen gas and said ionized gas is hydrogen ion plasma.

32. The method as defined in claim 30, wherein said predetermined amount of time is approximately 5 minutes.

* * * * *